(12) United States Patent  
Schroeder

(10) Patent No.: US 7,224,030 B2  
(45) Date of Patent: May 29, 2007

(54) METHOD AND APPARATUS FOR PRODUCING RECTANGULAR CONTACT HOLES UTILIZING SIDE LOBE FORMATION

(75) Inventor: Uwe Paul Schroeder, Fishkill, NY (US)

(73) Assignee: Infineon Technologies AG, Munich (DE)

( * ) Notice: Subject to any disclaimer, the term of this patent is extended or adjusted under 35 U.S.C. 154(b) by 105 days.

(21) Appl. No.: 10/863,786

(22) Filed: Jun. 8, 2004

(65) Prior Publication Data

US 2004/0234900 A1    Nov. 25, 2004

Related U.S. Application Data

(62) Division of application No. 09/559,090, filed on Apr. 27, 2000, now Pat. No. 6,767,682.

(51) Int. Cl.  
*H01L 27/01* (2006.01)

(52) U.S. Cl. ........................................ 257/347; 430/311

(58) Field of Classification Search ................ 430/311; 257/347; 427/96.1  
See application file for complete search history.

(56) References Cited

U.S. PATENT DOCUMENTS

| | | | |
|---|---|---|---|
| 5,045,417 A | 9/1991 | Okamoto | |
| 5,229,230 A | 7/1993 | Kamon | |
| 5,487,963 A | 1/1996 | Sugawara | |
| 5,591,550 A | 1/1997 | Choi et al. | |
| 5,593,801 A | 1/1997 | Yoshioka et al. | |
| 5,667,919 A | 9/1997 | Tu et al. | |
| 5,795,682 A | 8/1998 | Garza | |
| 5,856,049 A | 1/1999 | Lee | |
| 5,888,678 A | 3/1999 | Tzu et al. | |
| 5,935,736 A | 8/1999 | Tzu | |
| 6,057,064 A | 5/2000 | Lin | |
| 6,060,750 A * | 5/2000 | Hisamoto et al. | ........... 257/353 |
| 6,077,633 A | 6/2000 | Lin et al. | |

FOREIGN PATENT DOCUMENTS

| | | | |
|---|---|---|---|
| JP | 61-023342 | * | 1/1986 |
| JP | 11-266013 | | 9/1999 |

\* cited by examiner

*Primary Examiner*—Kathleen Duda  
(74) *Attorney, Agent, or Firm*—Slater & Matsil, L.L.P.

(57) ABSTRACT

An array of small square contact holes, on the order of magnitude of the exposing light wavelength, are formed by selecting the partial coherence and numerical aperture of the exposing light source and the pitch of the array of windows on an attenuating phase shifting mask so that side lobes formed by the exposing light being diffracted as it passes through the array of window constructively interfere with one another in the vicinity of a desired contact hole on the material surface. This constructive interference of side lobe patterns, in combination with the pattern formed by the light passing undiffracted through the array of windows, forms an array of square exposed regions on the material surface. When the material is a photoresist, the exposed regions can be selectively dissolved in order to form square patterns that can be used to etch square holes in the underlying substrate or layer. In subsequent steps, selected ones of the array of square holes can be filled in with a conductive material to form vias and selected others of the square holes can be filled in with an insulating material so as to avoid the formation of unintended vias or conducting paths.

24 Claims, 5 Drawing Sheets

METHOD AND APPARATUS FOR PRODUCING RECTANGULAR CONTACT HOLES UTILIZING SIDE LOBE FORMATION

This application is a divisional of patent application Ser. No. 09/559,090, entitled "Method for Producing Quadratic Contact Holes Utilizing Side Lobe Formation," filed on Apr. 27, 2000, which application is incorporated herein by reference.

FIELD OF THE INVENTION

This invention relates generally to photolithography for semiconductor fabrication and more particularly to forming quadratic contact holes and similar features using constructive interference of side lobe formations.

BACKGROUND OF THE INVENTION

As semiconductor feature sizes continue to shrink into the sub-micron range, the effects of light diffraction during photolithographic processes become more pronounced. Deep ultraviolet (UV) exposure tools use light sources having a 248 nm wavelength. When such tools are used to form semiconductor devices having feature sizes of 200 to 300 nm, the effects of light diffraction become quite pronounced.

One area where diffraction effects are a particular problem is in the formation of small rectangular features, such as contact holes and vias. Square features on a photomask pattern become rounded due to diffraction when the substrate wafer is exposed. Rounded holes have a greater resistance than rectangular contact holes of similar size, resulting in greater contact resistance. In order to prevent the increased resistance, a larger diameter round contact hole would be required, resulting in lower packing density (i.e. a greater spacing requirement). In either event, the rounded contact hole is less desirable than a rectangular contact hole of similar size.

The use of attenuated phase shift masks is well-known to offset the problems associated with light diffraction in small feature size products. The prior art offers many solutions which are geared toward eliminating side lobe patterns resulting from diffraction effects. For instance, Tzu teaches the use of an opaque ring around the phase shifting features to reduce the effects of side lobe formation in U.S. Pat. No. 5,935,736. Choi et al. teach the formation of "dummy" open regions in the phase shift mask, which dummy regions allow light to pass through unimpeded and 180 degrees out of phase with diffracted light that would otherwise form side lobes below the dummy open region in U.S. Pat. No. 5,591,550. Garza, in U.S. Pat. No. 5,795,682, also teaches the use of guard rings to destructively interfere with, and hence eliminate, side lobe patterns. Sugawara teaches the use of alternating patters of phase shifting and non-phase shifting patterns to cause destructive interference of side lobe patterns in U.S. Pat. No. 5,487,963.

The shortcoming of the prior art is that the various techniques to reduce or eliminate side lobe formation do not address the need for forming good rectangular patterns in dense patterns of small features. The present invention overcomes the shortcoming of the prior art, as will become apparent from the following description of preferred embodiments of the invention.

SUMMARY OF THE INVENTION

In one aspect, the present invention provides a method of forming a quadratic hole on a surface comprising coating the surface with a photoresist layer and exposing the photoresist layer to a light source, the light source having passed through a photomask. The photomask comprises a first window corresponding to the desired quadratic feature, whereby light from the light source and passing through the first window exposes a first portion of the desired quadratic feature on the surface, and a plurality of adjacent windows, whereby light passing through the adjacent windows form diffraction patterns. The diffraction patterns constructively interfere to expose a second portion of the desired quadratic feature on the surface. Finally, the photoresist layer is selectively dissolved to remove exposed portions of the photoresist layer and the portions of the surface underlying the portions of the photoresist layer that were removed are etched to form quadratic holes.

In another aspect, the present invention provides for an integrated circuit. The circuit includes a substrate, a conductive layer overlying the substrate, and an insulating layer overlying the conductive layer. The integrated circuit further includes a rectangular contact hole passing through the insulating layer to the conductive layer, the rectangular contact hole having been formed by exposing a photoresist layer on the surface of the insulating layer through a photomask with a plurality of rectangular windows, the rectangular windows having a pitch such that, for a given partial coherence of the exposing light source, the side lobe features formed from the rectangular windows constructively interfere to expose a rectangular portion of the photoresist layer.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts which can be embodied in a wide variety of specific contexts. The specific embodiments discussed are merely illustrative of specific ways to make and use the invention, and do not limit the scope of the invention.

Figure 1:
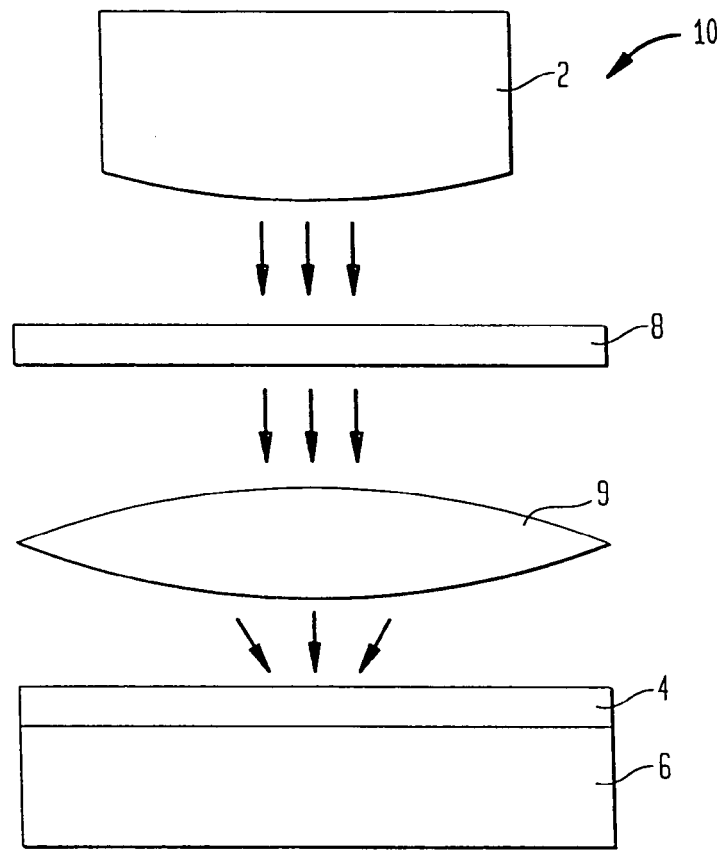
FIG. 1 illustrates a system for photolithographically forming patterned features on the surface of a substrate.

FIG. 1 illustrates in schematic form, a photolithographic processing stepper 10. The stepper comprises a light source 2 which is used to illuminate a photosensitive layer (a photoresist layer) 4 formed on a semiconductor wafer 6 or similar substrate. Patterns are formed on photoresist layer 4 by passing light from light source 2 through a photomask 8 upon which is formed the pattern desired to be transferred. The light also passes through focusing lens 9 prior to impinging upon layer 4.

Figure 2A:
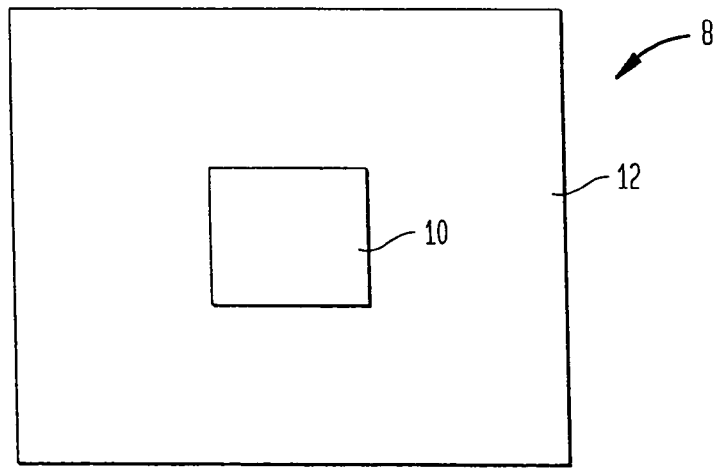
FIGS. 2a and 2b illustrate a prior art attenuated phase shift photomask and the spectral intensity profile of light passing through a small feature on the photomask.
Figure 2B:
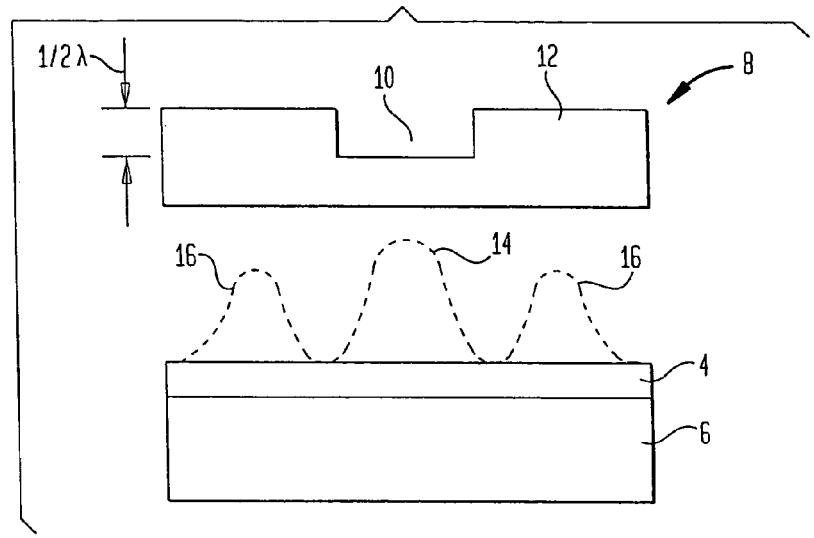

Further details will now be provided for a preferred embodiment photomask 8. FIGS. 2a and 2b illustrate a photomask 8 having a single pattern formed thereon, the pattern being a square opening. The pattern consists of a window region 10 surrounded by attenuating regions 12. Attenuating region 12 is formed by coating the photomask with an opaque material such as molybdenum silicide in the case of a 248 nm wavelength exposure light (for other wavelength exposure lights, different opaque material would be employed as is well known in the art). Preferably, this coating provides for about a 6% transmittance of light, although transmittance in the range of 4% to 20% will give acceptable results. Note from FIG. 2b that light passing through region 12 travels one half a wavelength further through the photomask than light passing through open window 10, resulting in a 180° phase shift between light passing through open window 10 and region 12. This phase shift will tend to lessen, but not eliminate, the intensity of the diffraction patterns 16 formed as light passes through open window 10, as shown in FIG. 2b. Curve 14 of FIG. 2b represents the intensity of light passing through photomask 8 and impinging upon photoresist layer 4. As shown, the light intensity is highest beneath open window 10, where the light from light source 2 passes through photomask 8 essentially unimpeded. Second order diffraction of the light results in peaks 16. Approximately 6% of the light from light source 2 passes through attenuating region 12, phase shifted by 180° as discussed above, which reduces but does not eliminate side lobe formation.

Figure 2C:
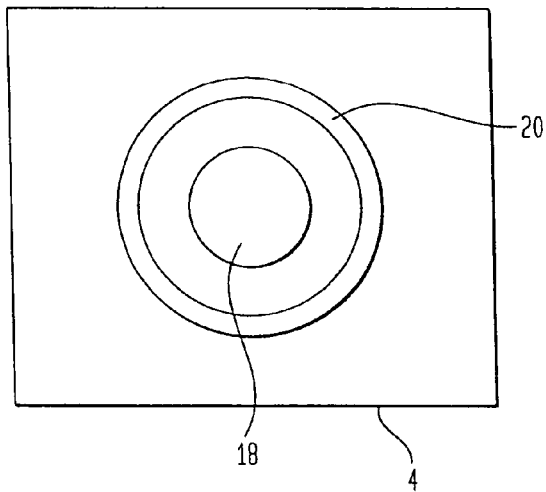
FIGS. 2c and 2d illustrate the resulting exposure pattern including side lobe formation for a single small feature on a prior art attenuated phase shift photomask and for an array of small features on the prior art attenuated phase shift photomask.

FIG. 2c illustrates the resulting pattern on the surface of photoresist layer 4. Note that two features are exposed on the layer. The first feature 18 corresponds to the region beneath open window 10. Note that the feature is essentially round due to corner rounding and other known diffraction phenomena. Side lobe 20 is also formed, corresponding to the region of light intensity 16 arising from the diffraction of light passing through open window 10.

Figure 2D:
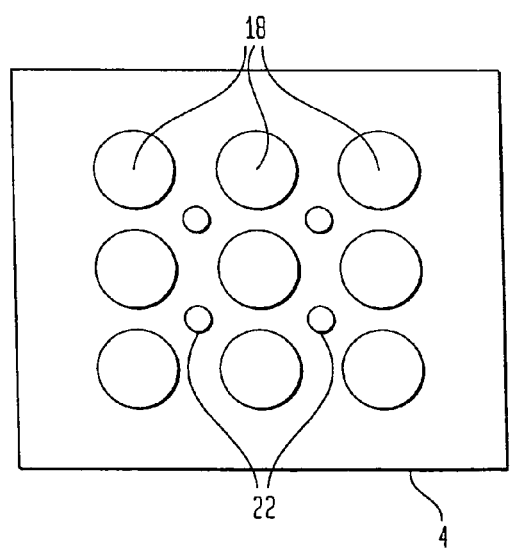

FIG. 2d illustrates the resulting exposure pattern when a plurality of open windows 10 are formed on photomask 8. For each such open window 10, a feature 18 is exposed on photoresist layer 4. Again, features 18 show the corner rounding effects of diffraction resulting from the exposure process. Also shown are features 22, which correspond to those regions where side lobes 20 of adjacent open windows 10 constructively interfere with one another such that the combined intensity of the side lobes 20 in the regions 22 is sufficient to fully expose the photoresist layer 4. This results in unintended and undesirable features being formed on the semiconductor wafer 6, possibly resulting in short-circuits, unwanted current paths, and other performance degrading results.

In the preferred embodiments of the present invention, undesirable side lobe features 22 are eliminated and corner rounding of contact hole 18 is minimized by positioning open windows 10 relative to each other such that for an open window 10, the side lobes 20 associated the surrounding open windows 10 constructively interfere with each other in the region that corner rounding of contact 18 would otherwise occur. By positioning the side lobes to occur where it is desirable to expose the photoresist, undesirable features 22 are eliminated, and the shape of desired feature 18 is improved. The following paragraphs further illustrate the invention with preferred embodiment examples.

EXAMPLE 1

Figure 3A:
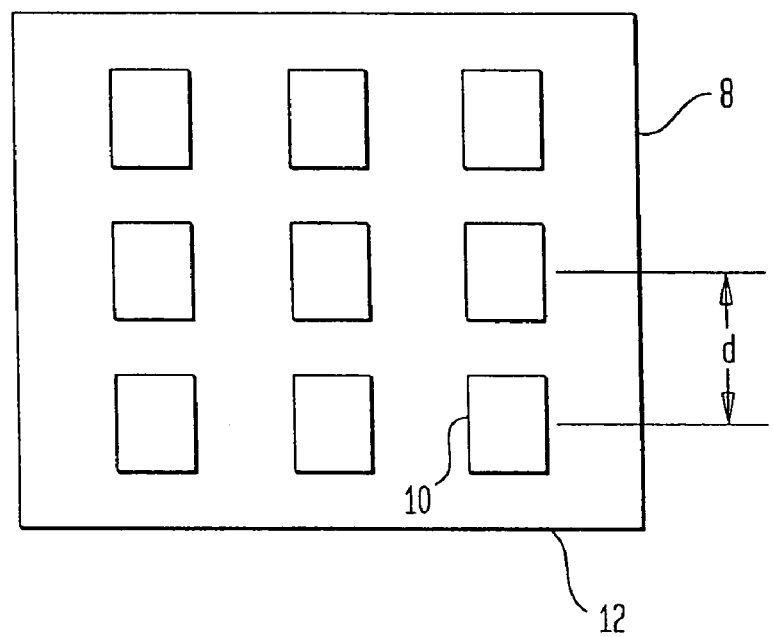
FIGS. 3a and 3b illustrate in plan view a preferred embodiment phase shift mask and resulting exposure pattern, respectively.
Figure 3B:
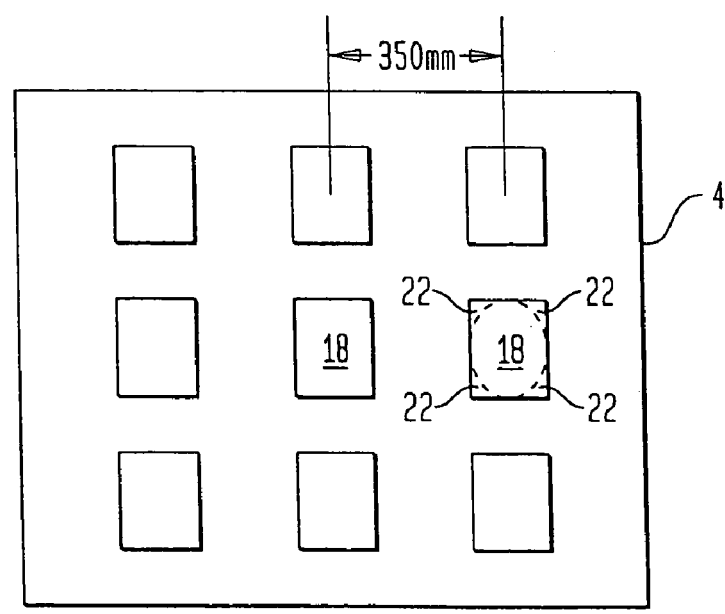

FIG. 3a illustrates a first exemplary photomask 8 used to create a pattern of small quadratic contact holes 18. Photomask 8 comprises attenuating region 12 and open windows 10. The resulting pattern on photoresist layer 4 is shown in FIG. 3b. The desired pattern to be exposed on photoresist layer 4 is an array of square shaped contact holes of size 225 nm by 225 nm. Photoresist layer 4 was comprised of a 5000 Angstrom thick layer of JSR M22G photoresist available from JSR, Corp., Tokyo, Japan, with a bottom antireflective coating of approximately 900 Angstroms thickness. The wafer was exposed using a Nikon DUV Scanner S203B with a numerical aperture of 0.68.

The photomask itself was formulated using attenuated phase shift photomask technology wherein attenuating region 12 provided for 6% transmittance. The pattern on the photomask was 4× the desired pattern on layer 4, with appropriate demagnification being accomplished via focusing lens 9. Deep UV light source 2 provides a partially coherent light beam with a 248 nm wavelength. Simulations dictated that side lobes 20 would constructively interfere in the desired corner regions of contact holes 18 when the 225 nm contact holes were spaced apart with a pitch of 350 nm (using a 248 nm wavelength light source). Hence open windows 10 were patterned on photomask 8 with a pitch of 350 nm.

In order to sufficiently expose photoresist layer 4 in the side lobe regions, the layer was overexposed at a rate of 78 mJ/cm$^2$. The partial coherence of light source 2 was selected at 0.44 sigma in order to generate sufficient side lobes to expose the corner regions of contact holes 18. A lower partial coherence would result in more side lobe formation (the intensity ratio between the main peak and the side lobe would become smaller). A greater partial coherence would hence result in lesser side lobe formation. Depending on the size of the contact mask feature, then, partial coherence can be readily adjusted for optimum side lobe formation. Typically, a partial coherence in the range of 0.3–0.65 will result in desirable side lobe formation for most desired feature sizes and pitches.

The resulting exposed photoresist layer 4 is illustrated in FIG. 3b. Note that a pattern of square contact holes is formed from the combination of rounded feature 18 forming the main portion of the contact hole and side lobe features 22 forming the corners portions. Although shown separately for illustration purposes, features 18 and 22 form a single feature (contact hole) in actual practice. Note that a novel and improved result is obtained by using the side lobe features to advantageous effect, rather than trying to minimize or eliminate those features as is taught in the prior art.

In the following examples, only select ones of the resulting contact holes 18 are required for further processing of an integrated circuit. The other contact holes 18 are necessary only to ensure that the selected contact holes have the desired square shape. Further processing is therefore preferred in order to eliminate unnecessary contact holes.

EXAMPLE 2

In this example, photoresist layer 4 has been exposed using the methods of any of the preceding examples, resulting in the pattern illustrated in FIG. 3b. Only the center-most contact hole 18, however, is needed for the circuit, the surrounding contact holes having been formed solely to ensure that the center-most contact hole has an acceptable square shape and to prevent undesirable side lobe features for forming around the desired contact hole.

In order to block out (remove) the unnecessary contact holes, a second exposure involving a second photoresist layer and a blocking photomask is employed. This blocking photomask will have an open window 10 only corresponding to the desired (center-most) contact hole, and the remaining contact holes will be placed under an attenuating region 12 of the blocking photomask. In this way, only the desired contact hole will be exposed during the second exposure step. In order to prevent the first photoresist layer 4 from being dissolved along with the exposed portions of the second photoresist layer, the first photoresist layer can be crosslinked prior to the second photolithographic step through radiation exposure, chemical cross-linking, e-beam exposure, or other well known cross-linking methods.

EXAMPLE 3

Figure 4A:
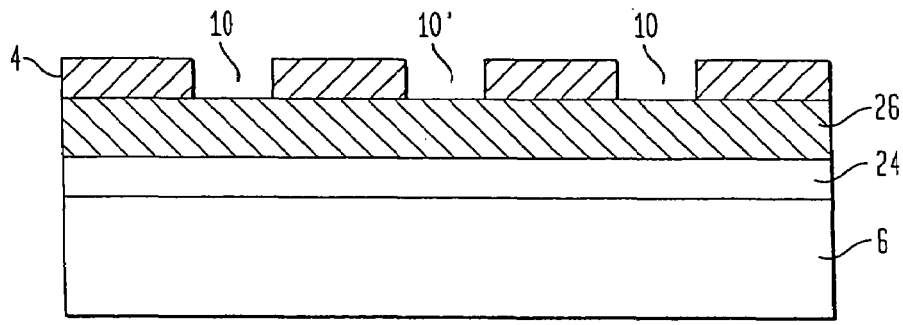
FIGS. 4a through 4g illustrate process steps for forming a square contact hole.

In this example. photoresist layer 4 has been exposed using the methods of the preceding examples, resulting in the pattern illustrated in FIG. 3b. FIGS. 4a through 4g illustrate the process steps to eliminate the unnecessary contact holes. FIG. 4a provides a cross section view of semiconductor wafer 6, including conducting region 24 formed atop the wafer and insulating layer 26 formed atop the conducting region. Photoresist layer 4 has been photolithographically processed as described above, resulting in the patterned layer 4 illustrated in FIG. 4a. As will be apparent to one skilled in the art, desired contact bole 10' is intended to provide a conductive pathway through insulating layer 26 by which electrical contact with buried conductive region 24 can be made. The conductive pathway through insulating layer 26 is formed by filling contact hole 10' with conductive material.

Figure 4B:
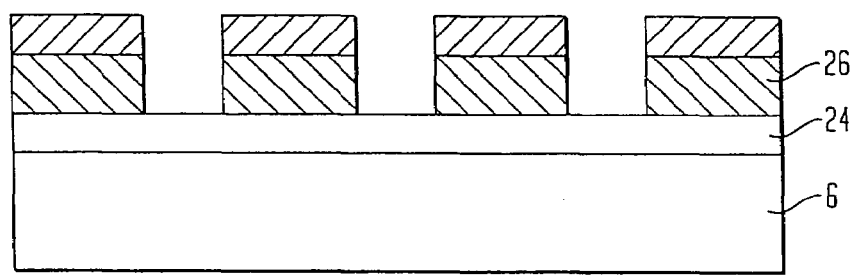
Figure 4C:
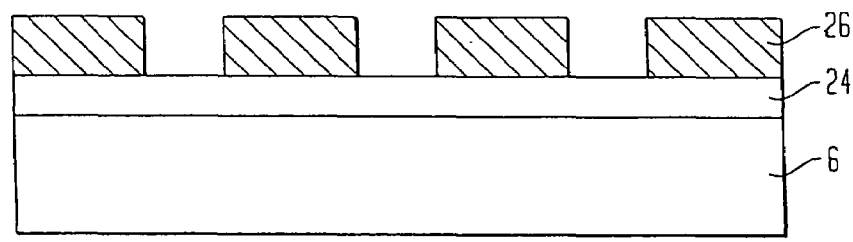
Figure 4D:
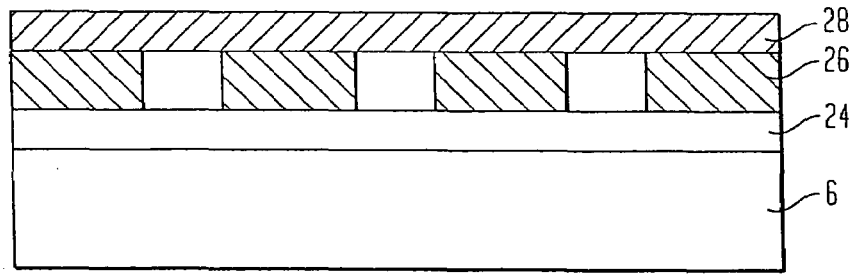
Figure 4E:
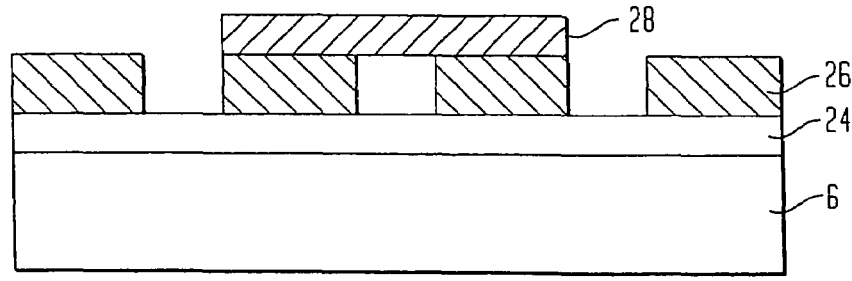
Figure 4F:
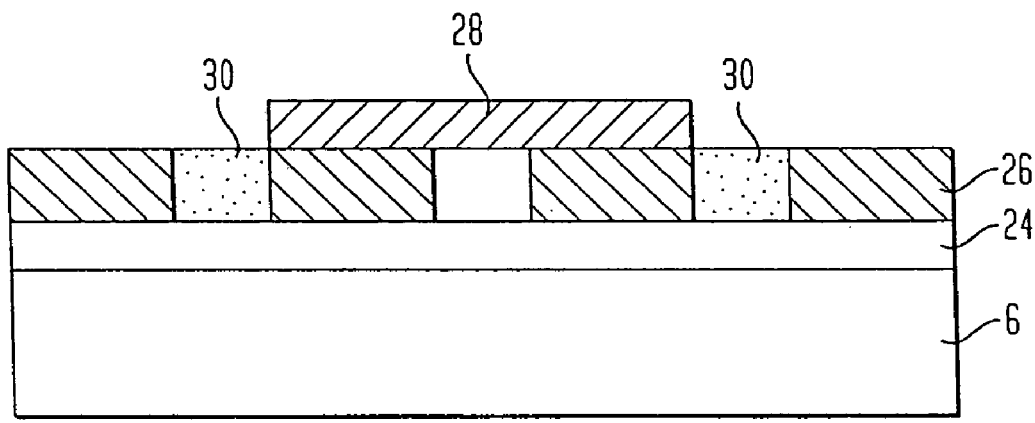
Figure 4G:
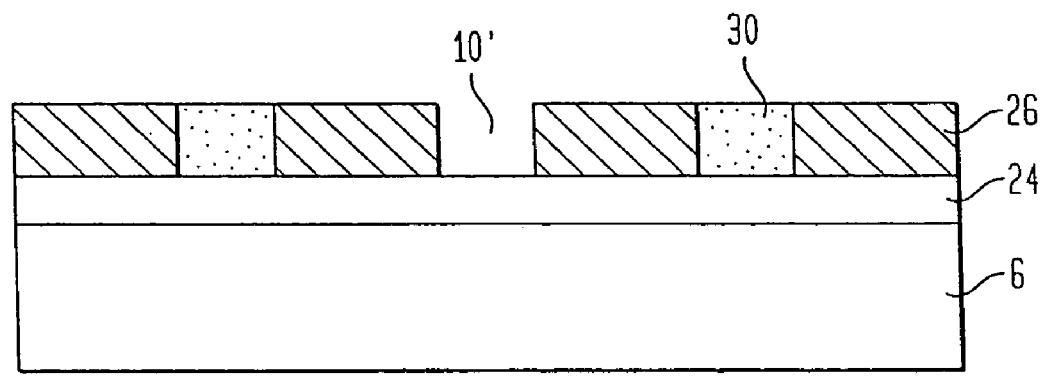

In FIG. 4b, insulating layer 26, which is preferably a silicon dioxide or polysilicon layer is etched using known etching techniques. Three contact holes are etched into the layer because of the pattern of photoresist layer 4. In FIG. 4c, photoresist layer 4 is removed. In FIG. 4d a second photoresist layer 28 is applied and a blocking pattern is formed in layer 28. This blocking pattern is formed over desired contact hole 10' only. Once second photoresist layer 28 has been exposed with the blocking pattern, the unexposed portions of the layer 28 is removed as shown in FIG. 4e. Next, unnecessary contact holes 10 are filled with an insulator material 30, such as plasma deposited polymer, spin coated polymer, or the like, as shown in FIG. 4f. In this way, the unnecessary contact holes are removed. Finally, as shown in FIG. 4g, the remaining photoresist layer 28 is removed, leaving a single contact hole 10 in the desired location.

As will be apparent from the above described examples, the present invention can be embodied in numerous embodiments. Square contact holes can be obtained for a variety of photolithographic processes, provided that the pitch and size of the open windows are adjusted to cause side lobe formation in the region of the contact hole corners, and that the illumination conditions (particularly partial coherence) is adjusted such that the photoresist layer is sufficiently exposed. Other light sources, such as commonly used 193 nm and 365 nm wavelength light sources can be employed with the teachings of the present invention, provided the partial coherence, numerical aperture, and focus are properly adjusted, as taught herein, for the size and pitch of the desired rectangular features.

While this invention has been described with reference to illustrative embodiments, this description is not intended to be construed in a limiting sense. It should be understood that the present invention also relates to machine readable media on which are stored reticle designs meeting the requirements of this invention, or program instructions for performing methods of this invention. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An integrated circuit comprising:
   a substrate;
   a conductive layer overlying the substrate;
   an insulating layer overlying the conductive layer;
   a matrix of substantially rectangular holes formed in said insulating layer, said matrix of substantially rectangular holes having been formed by a photolithographic process and having a pitch, said pitch being a function of at least one parameter of said photolithographic process;
   least one of said substantially rectangular holes located for defining a conductive pathway through said insulating layer; and
   an insulator fill in another at least one of said substantially rectangular holes.

2. The integrated circuit of claim 1 wherein said at least one parameter of said photolithographic process is a pitch of exposing pattern windows on a photomask, an exposing light wavelength, and an exposing light partial coherence.

3. The integrated circuit of claim 2 wherein said exposing light wavelength is 248 nm.

4. The integrated circuit of claim 2 wherein said pitch of exposing pattern windows on a photomask is about 320 nm to about 350 nm.

5. The integrated circuit of claim 2 wherein said partial coherence is about 0.44 sigma.

6. The integrated circuit of claim 1 further comprising a conductive material formed in said at least one substantially rectangular hole.

7. An integrated circuit comprising:
   a first layer;
   a first hole in said first layer for defining a conductive pathway through said first layer, said first hole having been formed by a photolithographic process;
   a second and third hole in said first layer, said second and third holes having been formed by said photolithographic process; and
   an insulating material substantially filling said second and third holes;
   wherein said second and third holes are respectively spaced apart from said first hole such that side lobes from said second and third holes formed during said photolithographic process constructively interfere and assist in the formation of said first hole as a substantially rectangular hole.

8. The integrated circuit of claim 7 wherein said insulating material comprises a polymer.

9. The integrated circuit of claim 7 further comprising fourth through eighth boles in said first layer, wherein each of said respective fourth through eighth holes are respectively spaced apart from said first hole such that side lobes from said fourth through eighth holes formed during said photolithographic process constructively interfere and assist in the formation of said first hole as a substantially rectangular hole.

10. The integrated circuit of claim 7 wherein said first layer comprises an insulating layer formed over a conductive layer.

11. The integrated circuit of claim 7 further comprising a conductive material formed in said first hole.

12. An integrated circuit comprising:
a substrate;
a conductive layer overlying the substrate; an insulating layer overlying the conductive layer;
a matrix of substantially rectangular contact holes formed in said insulating layer, said matrix of substantially rectangular holes having been formed by a photolithographic process using a photomask having a corresponding matrix of exposure windows, said exposure windows having a predetermined size and pitch such tat a side lobe pattern from each said exposure window constructively interferes with an exposure pattern for each adjacent exposure window;
at least one of said substantially rectangular holes for defining a conductive pathway through said insulating layer; and
an insulating material substantially filling at least a second one of said substantially rectangular holes.

13. The integrated circuit of claim 12 wherein said substantially rectangular holes are substantially square.

14. The integrated circuit of claim 13 wherein said substantially rectangular holes are about 56 nm by 56 nm.

15. The integrated circuit of claim 12 wherein said photolithographic process uses a partially coherent exposure light of between about 193 nm and about 365 nm wavelength.

16. The integrated circuit of claim 15 wherein said partial coherence is about 0.44 sigma.

17. The integrated circuit of claim 12 further comprising a conductive material formed in said at least one of said substantially rectangular holes for providing a conductive pathway.

18. An integrated circuit comprising:
a substrate;
a conductive layer overlying the substrate;
an insulating layer overlying the conductive layer;
a matrix of substantially rectangular holes formed in said insulating layer, said matrix of substantially rectangular holes having a pitch, such that said substantially rectangular holes are uniformly spaced relative to one another;
at least one of said substantially rectangular holes located for defining a conductive pathway through said insulating layer; and
an insulator fill in another at least one of said substantially rectangular holes.

19. The integrated circuit of claim 18 wherein the matrix of substantially rectangular holes comprises nine contact holes arranged in three rows and three columns.

20. The integrated circuit of claim 19 wherein the at least one of said substantially rectangular holes is a center one of the holes and the insulator fill is in remaining ones of the contact holes.

21. The integrated circuit of claim 18 wherein the insulator fill comprises a polymer.

22. The integrated circuit of claim 18 wherein the insulating layer consists of first material and the insulator fill consists of a second material that is different than the first material.

23. The integrated circuit of claim 22 wherein the insulating layer comprises an oxide and the insulator fill comprises a polymer.

24. The integrated circuit of claims 18 further comprising a conductive material formed in said at least one rectangular hole.

* * * * *

UNITED STATES PATENT AND TRADEMARK OFFICE
CERTIFICATE OF CORRECTION

PATENT NO. : 7,224,030 B2
APPLICATION NO. : 10/863786
DATED : May 29, 2007
INVENTOR(S) : Schroeder Page 1 of 1

It is certified that error appears in the above-identified patent and that said Letters Patent is hereby corrected as shown below:

In Col. 7, line 2, delete "boles" and insert --holes--.
In Col. 7, line 23, delete "tat" and insert --that--.

Signed and Sealed this

Fourth Day of September, 2007

JON W. DUDAS
*Director of the United States Patent and Trademark Office*